(12) United States Patent
Wrathall

(10) Patent No.: US 6,307,409 B1
(45) Date of Patent: Oct. 23, 2001

(54) GATE DRIVER CIRCUIT FOR HIGH AND LOW SIDE SWITCHES WITH PRIMARY AND SECONDARY SHOOT-THROUGH PROTECTION

(75) Inventor: Robert S. Wrathall, Scotts Valley, CA (US)

(73) Assignee: Micrel, Incorporated, San Jose, CA (US)

( * ) Notice: Subject to any disclaimer, the term of this patent is extended or adjusted under 35 U.S.C. 154(b) by 0 days.

(21) Appl. No.: 09/733,317

(22) Filed: Dec. 8, 2000

(51) Int. Cl.[7] .................................................. H03K 3/00
(52) U.S. Cl. .............................. 327/112; 326/27; 326/82; 326/86
(58) Field of Search ........................... 327/112, 108, 327/110, 111, 374, 376, 377; 326/22, 23, 26, 27, 82, 83, 86, 87

(56) References Cited

U.S. PATENT DOCUMENTS

| | | | |
|---|---|---|---|
| 5,365,118 | 11/1994 | Wilcox | 327/109 |
| 5,408,150 | 4/1995 | Wilcox | 327/108 |
| 5,731,694 | 3/1998 | Wilcox et al. | 323/287 |
| 5,859,510 * | 1/1999 | Dolan et al. | 318/254 |
| 5,994,856 * | 11/1999 | Menegoli | 318/254 |
| 5,994,885 | 11/1999 | Wilcox et al. | 323/285 |
| 6,130,563 * | 10/2000 | Pilling et al. | 327/111 |
| 6,236,273 * | 5/2001 | Lewyn | 330/279 |

* cited by examiner

Primary Examiner—Tuan T. Lam
Assistant Examiner—Hiep Nguyen
(74) Attorney, Agent, or Firm—Skjerven Morrill MacPherson LLP; Carmen C. Cook

(57) ABSTRACT

A driver circuit for alternately driving a first transistor and a second transistor connected in series includes primary and secondary anti-shoot-through protection. The driver circuit prevents shoot-through at the first and second transistors by using a pair of switch lock-out signals. The switch lock-out signals prevent one transistor from turning on until the other transistor is turned off. The driver circuit eliminates shoot-through in the driver devices driving the first and second transistors by using a pair of driver lock-out signals. The driver devices are turned on only briefly during the transitions of the first and second transistors. Otherwise, the driver devices are turned off. The driver lock-out signals ensure that no contention occurs between the driver devices and furthermore, set up the driver devices for the next On-Off switching sequence. The driver circuit can achieve a fast switching operation as well as improve the efficiency of the power transistors.

46 Claims, 3 Drawing Sheets

GATE DRIVER CIRCUIT FOR HIGH AND LOW SIDE SWITCHES WITH PRIMARY AND SECONDARY SHOOT-THROUGH PROTECTION

BACKGROUND OF THE INVENTION

1. Field of the Invention

The invention relates to a driver circuit for power switches, and more particularly to a driver circuit for power switches including anti-shoot-through protection.

2. Description of the Related Art

MOSFET devices or MOS transistors are used as power switches in many applications. A common application involves using two MOS power transistors stacked in series between two power supply rails as the output stage of a switching regulator. This is conventionally referred to as a "half-bridge" configuration. FIG. 1 illustrates a pair of serially connected MOS power transistors (or power switches) driven by a driver circuit. An upper switch 2 (a PMOS transistor) and a lower switch 4 (an NMOS transistor) are connected in series between a positive power supply and ground (or a negative power supply). The switch output voltage $V_{SW}$ (node 5) of the power switches may be coupled to an LC filter circuit 11 to generate an output voltage $V_{OUT}$ (node 13) for driving a load 12, or other high speed power application. A control signal XON on lead 1 controls the on and off state of the two power switches. Generally, the control signal XON has two active states: a first state for turning on lower switch 4 and turning off upper switch 2 and vice versa for the second state. A passive state also exists where both switches are turned off. A driver circuit 6, including a upper driver device 7 and a lower driver device 8, is used to drive power switches 2 and 4 in response to control signal XON so that only one power switch is turned on at a time. Here, upper driver device 7 and lower driver device 8 generate gate control signals PGATE and NGATE for controlling upper switch 2 and lower switch 4, respectively. Because MOS power switches 2 and 4 are typically large devices with large gate capacitance, the power switches are driven by fairly large driver devices in order to turn the power switches on or off quickly. Typically, upper driver device 7 and lower driver device 8 are each implemented as an inverter (e.g., a CMOS inverter) with large devices so as to generate a gate control signal having a sufficient drive voltage.

Because power switches 2 and 4 are both large MOS transistors, it is very important to ensure that both switches are not turned on simultaneously in operation. If both power switches 2 and 4 are turned on at the same time, a low resistance path is created between the two power rails and a "shoot-through" condition results where a large current flows through the two power switches. Shoot-through is undesirable because it wastes power and the large current flow can cause fluctuations in the power supply voltages. In the extreme case, the large current flow in the power switches can cause over-heating, damaging the power switches themselves. Conventional techniques for preventing shoot-through in the power switches (also called primary shoot-through protection) include introducing delays in the gate control signals to prevent turning both switches on simultaneously. As shown in FIG. 1, delay circuits 9 and 10 can be included in driver circuit 6 to delay turning on one power switch until the other power switch is turned off. Another conventional shoot-through protection technique involves monitoring the gate voltage of the power switches to determine when the "ON" power switch is turned off. The "OFF" power switch is turned on only after the gate voltage of the "ON" power switch reaches a level indicating that it is sufficiently turned off. Although these techniques are effective in preventing shoot-through in the power switches, they have the disadvantage of introducing undesirable delays in the switching operation. For example, the gate voltage monitor technique can cause a delay while one power switch is being turned off and can also cause a delay when the other power switch is being turned on. These delays are cumulative and can seriously impact the performance of the switching regulator. Also, delay circuits 9 and 10 are typically not scalable so that any changes in the circuit operating voltages or sizes of the power switches would require determination of new delay values.

Furthermore, while the primary shoot-through protection described above can be effective in preventing shoot-through in the MOS power switches themselves, the shoot-through protection techniques described above do not prevent shoot-through in the driver devices. As described above, the driver devices are themselves large devices for providing sufficient drive voltages for the power switches. Therefore, shoot-through current in the driver devices themselves can be large and problematic. Hence, it may also be necessary to eliminate shoot-through in the driver devices as well. This is referred to as secondary shoot-through protection.

Therefore, it is desirable to provide a driver circuit for driving serially connected power switches and including primary and secondary anti-shoot-through protection.

SUMMARY OF THE INVENTION

According to the present invention, a driver circuit for alternately driving a first transistor and a second transistor in response to a switch control signal is provided. The first and second transistors, typically power transistors, are connected in series between a first power supply and a second power supply and generate an output voltage at an output node for driving a load. The driver circuit includes a first driver circuit portion for driving a control terminal of the first transistor in response to the switch control signal. The first driver circuit portion includes a first control path for generating a turn-on signal for turning on the first transistor; a second control path for generating a turn-off signal for turning off the first transistor; and a third control path for generating a holding signal for holding an on or off state of the control terminal of the first transistor. The third control path has a drive capability less than the drive capability of the first control path or the second control path. In operation, the first control path enables the turn-on signal and the third control path enables the hold signal only after the second transistor is turned off. The first control path disables the turn-on signal and the second control path disables the turn-off signal when the control terminal of the first transistor has moved to a respective on or off state. Finally, the holding signal of the third control path holds the on-off state of the control terminal of the first transistor when the turn-on signal or the turn-off signal is disabled.

In another embodiment, the driver circuit may further include a second driver circuit portion for driving a control terminal of the second transistor in response to the switch control signal. The second driver circuit includes a fourth control path for generating a turn-on signal for turning on the second transistor, a fifth control path a fifth control path for generating a turn-off signal for turning off the second transistor; and a sixth control path for generating a holding signal for holding an on or off state of the control terminal of the second transistor. The sixth control path having a drive capability less than a drive capability of the fourth control path or the fifth control path. The second driver circuit portion operation in an analogous manner as the first driver circuit portion.

The driver circuit of the present invention eliminates shoot-through at the first and second transistors which are typically power transistors or power switches. Primary shoot-through in the first and second transistors is eliminated by using an upper and a lower switch lock-out signal. For instance, the first transistor is not turned on until the driver circuit senses that the second transistor is turned off. Moreover, the driver circuit of the present invention provides secondary shoot-through protection in the driver devices driving each of the first transistor or the second transistor by using an upper driver lockout signal and a lower driver lockout signal. For instance, the driver devices for the first transistor are turned on only briefly during the transitions of the first transistor. Otherwise, the driver devices are turned off and are put in a high impedance state. The driver lock-out signals effectively eliminate the possibilities that both of the driver devices for either the first or the second transistor are turned on concurrently. The output state of the driver devices is hold by the third or the sixth control path (also called the gate holding path) including devices having a "weak" drive capability. Therefore, any shoot-through condition occurring in the devices in the gate holding path is insignificant and can be tolerated. Furthermore, the driver circuit is set up for the next turn-on sequence at the end of a turn-off sequence and vice versa. Thus, the driver circuit of the present invention can achieve a fast switching operation as well as improve the efficiency of the power transistors.

The present invention is better understood upon consideration of the detailed description below and the accompanying drawings.

BRIEF DESCRIPTION OF THE DRAWINGS

In the present disclosure, like objects which appear in more than one figure are provided with like reference numerals.

DETAILED DESCRIPTION OF THE PREFERRED EMBODIMENTS

In accordance with the present invention, a driver circuit for alternately driving an upper power transistor and a lower power transistor connected in series includes primary and secondary anti-shoot-through protection. The driver circuit of the present invention includes an upper driver circuit for driving the upper power transistor and a lower driver circuit for driving the lower power transistor. The driver circuit operates in response to a switch control signal for alternately turning on the upper power transistor or the lower power transistor. Each of the upper and lower driver circuits generates a switch lock-out signal to prevent the other power transistor from turning on until the power transistor it is driving has turned off. The delay time to turn on one power transistor relative to the turning off of the other power transistor can be adjusted by including the desired amount of propagation delays in the signal path of the switch lock-out signal. The driver circuit of the present invention provides secondary anti-shoot-through protection for the driver devices in each of the upper and lower driver circuits for driving the power transistors. Shoot-through conditions in the driver devices are eliminated by turning the driver devices on only during the transitions of the power transistors. Otherwise, the driver devices are turned off or are kept in a high impedance state. Thus, no contention between the driver devices in either the upper driver circuit or the lower driver circuit can occur. Furthermore, the upper and lower driver circuits are set up for the next turn-on sequence at the end of a turn-off sequence and vice versa. Thus, the driver circuit of the present invention can achieve a fast switching operation as well as improve the efficiency of the power transistors.

Figure 1:
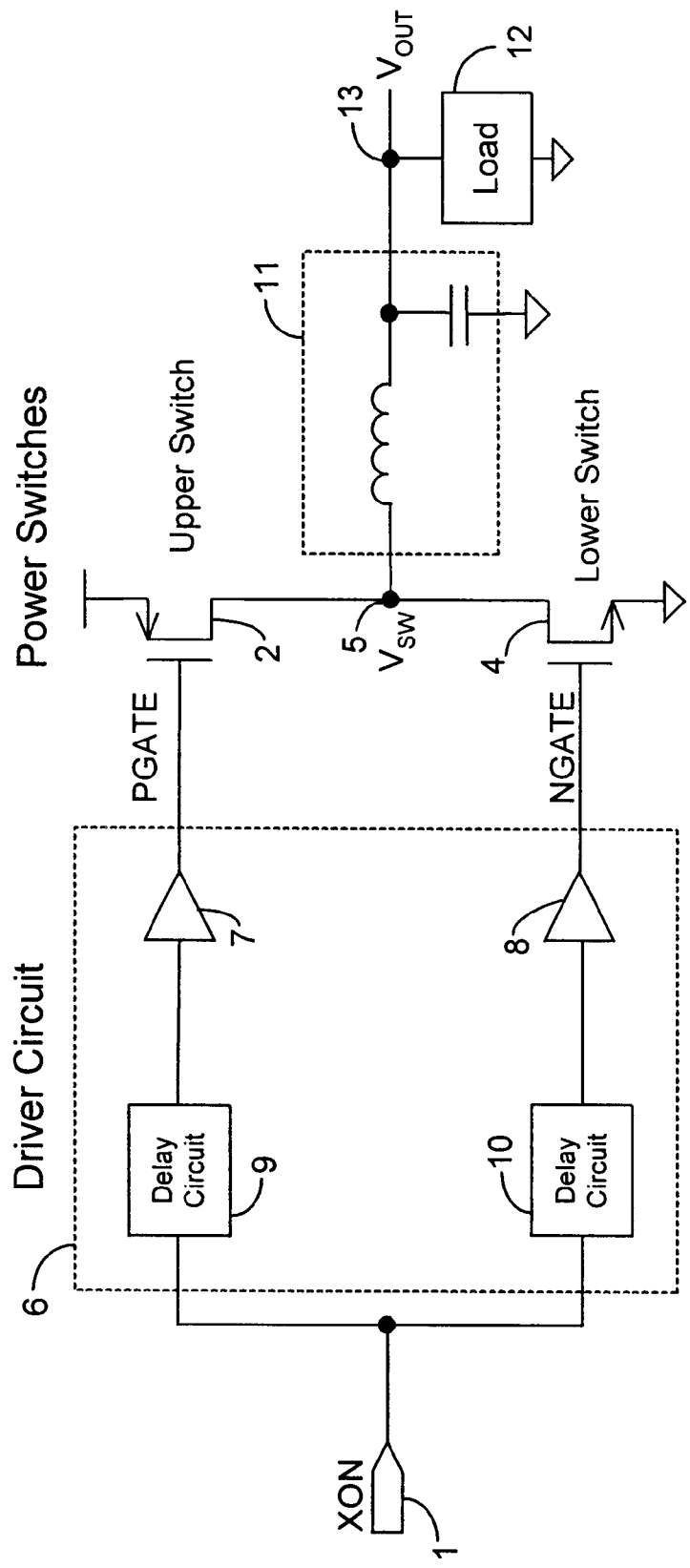
FIG. 1 is a schematic diagram of a pair of serially connected MOS power transistors driven by a driver circuit.
Figure 2:
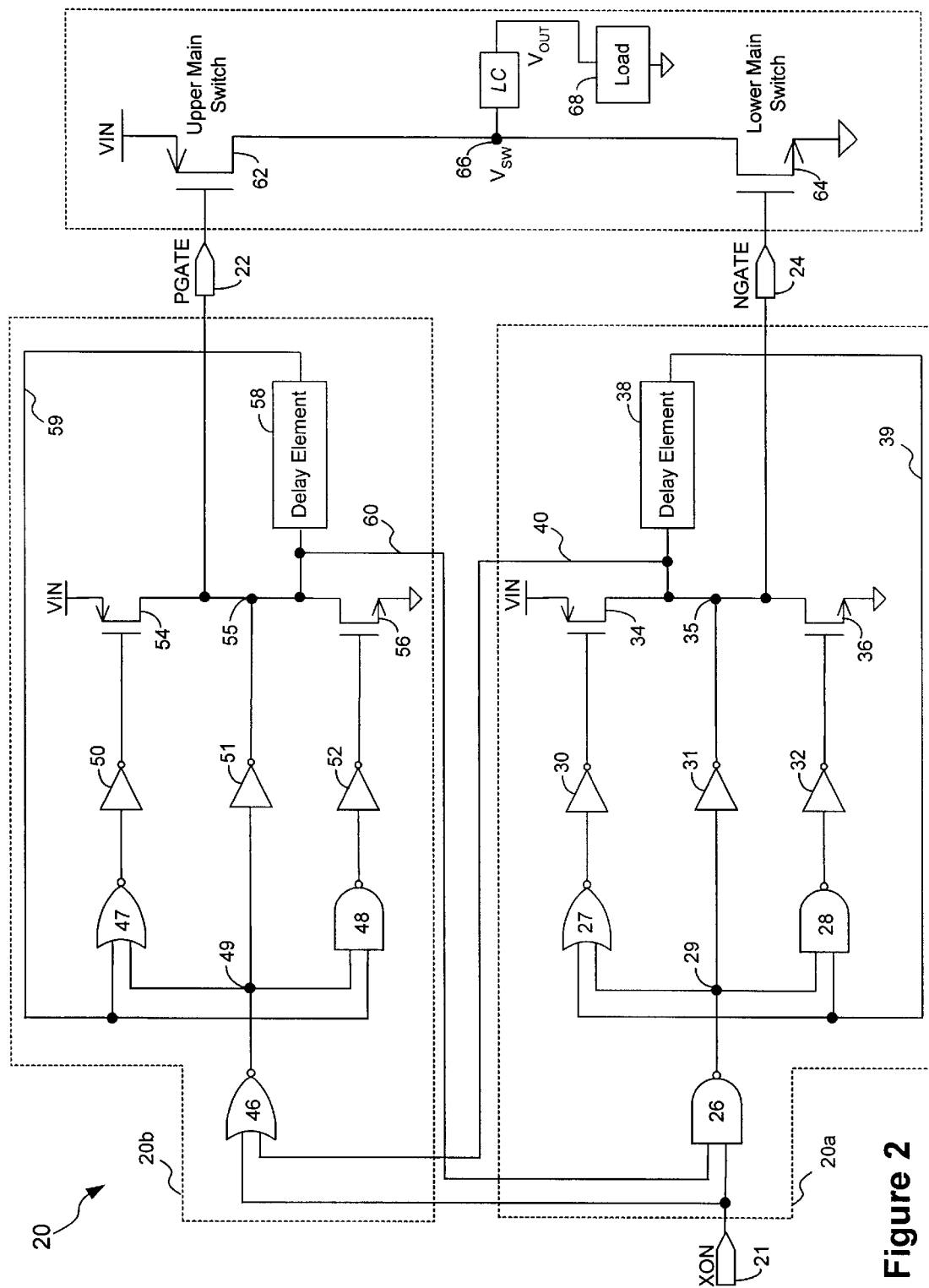
FIG. 2 is a schematic diagram of a driver circuit for alternately driving a pair of power transistors in a half-bridge configuration according to one embodiment of the present invention.

FIG. 2 is a schematic diagram of a driver circuit for alternately driving a pair of power transistors in a half-bridge configuration according to one embodiment of the present invention. Driver circuit 20 receives a switch control signal XON as input signal on lead 21. Typically, the switch control signal XON has two active states: a first state for turning on the lower power transistor and turning off the upper power transistor and a second state for turning on the upper power transistor and turning off the lower power transistor. A passive state also exists where both the upper power transistor and the lower power transistor are turned off. In the present embodiment, the first active state of the switch control signal XON is a logic high level (i.e., a logic "1") and the second active state of the switch control signal XON is a logic low level (i.e., a logic "0"). Driver circuit 20 generates a PGATE output signal at output terminal 22 for controlling an upper power transistor 62 and an NGATE output signal at output terminal 24 for controlling a lower power transistor 64. In the present embodiment, upper power transistor 62 is a PMOS transistor and lower power transistor 64 is an NMOS transistor. Of course, driver circuit 20 can be coupled to drive any types of power transistors, including n-channel or p-channel MOSFET devices and NPN or PNP bipolar transistors. An inverter may be coupled to output terminals 22 and 24 to provide the appropriate logic level for controlling the power transistors. Upper power transistor 62 and lower power transistor 64 generates a switch output voltage $V_{SW}$ at node 66 which is coupled to an LC filter circuit 67 and generates an output voltage $V_{OUT}$ (node 69) for driving a load 68.

Driver circuit 20 includes two circuit portions: a lower driver circuit 20a for generating the output signal NGATE for driving lower power transistor 64 and an upper driver circuit 20b for generating the output signal PGATE for driving upper power transistor 62. Each of lower driver circuit 20a and upper driver circuit 20b includes a pair of driver devices connected in series between a power supply VIN and ground (or a negative power supply). The driver devices generate the output signals PGATE and NGATE for driving the control terminals of the power transistors. Referring to FIG. 2, lower driver circuit 20a includes PMOS transistor 34 and NMOS transistor 36 as the driver devices which generate output signal NGATE at node 35. Upper driver circuit 20b includes PMOS transistor 54 and NMOS transistor 56 as the driver devices which generate output signal PGATE at node 55. As described above, because the power transistors are usually large devices with large gate capacitance, the driver devices are also large devices themselves to provide sufficient drive voltage for driving the power transistors. Because shoot-through occurring at the large driver devices can be as problematic as shoot-through occurring at the power transistors, driver circuit 20 of the present invention provides effective anti-shoot-through protection for eliminating shoot-through at the driver devices as well as at the power transistors.

Lower driver circuit 20a includes a NAND gate 26 receiving as input signals the switch control signal XON (on lead 21) and a lower switch lock-out signal (on lead 60). NAND gate 26 determines whether and when lower power transistor 64 is to be turned on. Lower power transistor 64 is to be turned on when NAND gate 26 outputs a logic low level. Otherwise, lower power transistor 64 is turned off. NAND gate 26 generates a logic low level on output node 29 only when both the control signal XON and the lower switch lock-out signal (lead 60) are at a logic high value. The lower switch lock-out signal on lead 60 is generated in upper driver circuit 20b and will be described in more detail below. Basically, when upper power transistor 62 is turned on, the lower switch lock-out signal has a low logic level, prohibiting lower driver circuit 20a from turning lower power transistor 64 on.

Lower driver circuit 20a further includes three control paths. The first control path includes a NOR gate 27 and an inverter 30 connected in series. NOR gate 27 receives as input signals the output signal from NAND gate 26 (node 29) and a lower driver lock-out signal on lead 39. The combination of NOR gate 27 and inverter 30 generates an output signal for driving the control terminal of the upper driver device which is PMOS transistor 34 in the present embodiment. In operation, PMOS transistor 34 is turned on only when the output signal of NAND gate 26 and the lower driver lock-out signal are both at a logic low level. The generation of the lower driver lock-out signal will be explained in more detail below. Basically, the lower driver lock-out signal functions to turn off PMOS transistor 34 after the PMOS transistor acts to turn on lower power transistor 64 in response to the switch control signal XON. PMOS transistor 34 is a large device having a sufficient drive capability to drive the large capacitance of lower power transistor 64. In the present embodiment, PMOS transistor 34 is used primarily to drive the gate voltage of lower power transistor 64 to a sufficient level for turning on the power transistor and is therefore turned on only momentarily while lower power transistor 64 is being turned on. Then PMOS transistor 34 is turned off (or put in an high impedance state) by the action of the lower driver lock-out signal. In the present embodiment, PMOS transistor 34 and other driver devices in driver circuit 20 are only turned on long enough to move the control voltage of the power transistor to a logic threshold level plus a fixed delay time. The lower driver lock-out signal (lead 39) and the upper driver lock-out signal (59) to be described later are used to control the amount of time the driver devices are turned on to perform their respective functions of driving the control voltage of the power transistors. In the present description, the logic threshold level is taken to mean a voltage level mid-way between the power supplies coupled to drive the power transistors (i.e. VIN and ground). Thus, when VIN is 6 volts, the logic threshold is taken to be 3 volts. As will be explained in more details below, turning off the driver devices after each power transistor transition has the advantage of preventing shoot-through in the driver devices and also has the benefit of setting up the driver circuit for the next power transistor transition. Thus, driver circuit 20 is capable of high speed operation while providing effective anti-shoot-through protection.

Figure 3:
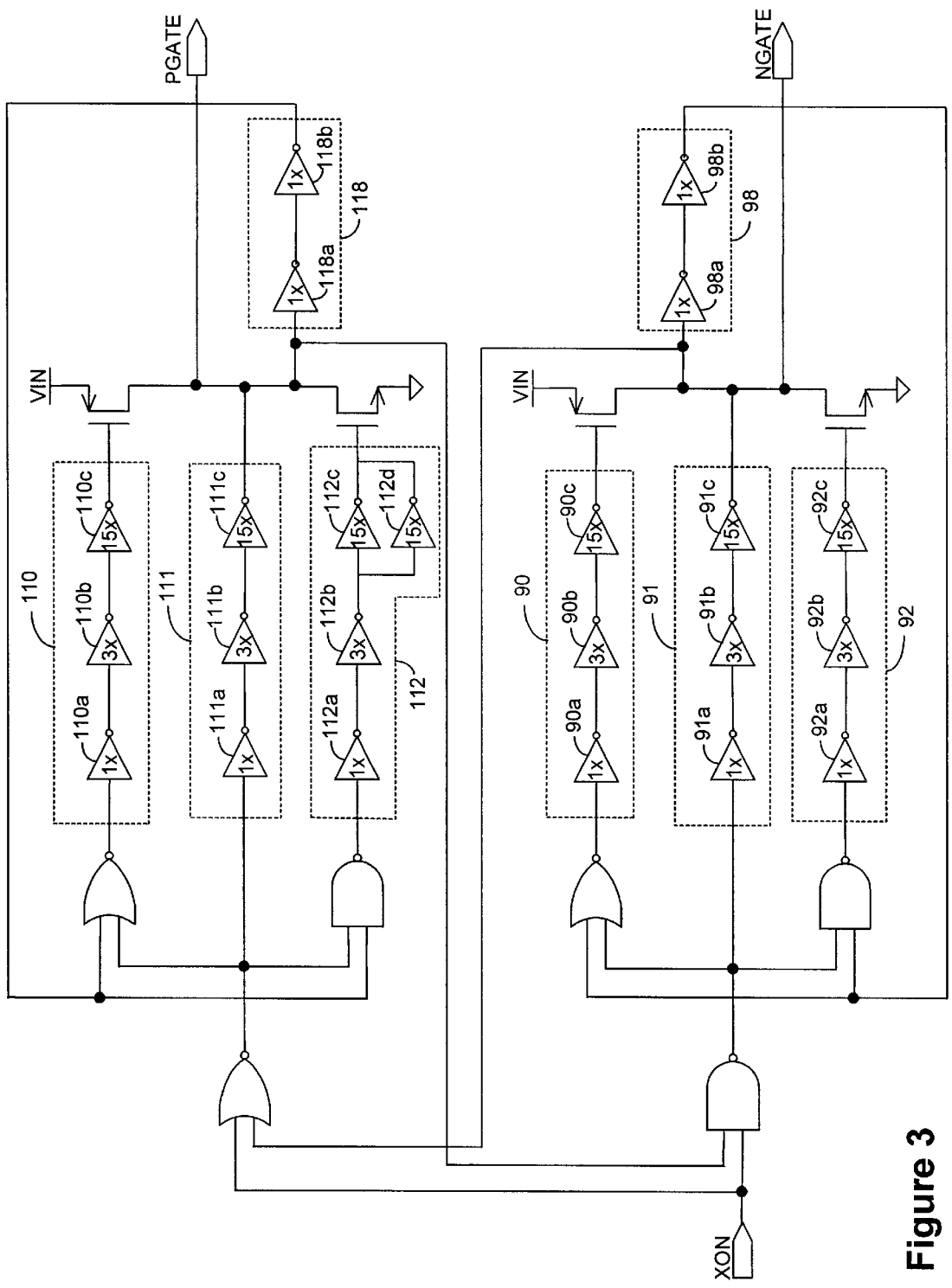
FIG. 3 is a schematic diagram of one implementation of the driver circuit of the present invention.

In the present embodiment, inverter 30 functions as an amplifier for amplifying the output signal of NOR gate 27. Signal amplification is needed because inverter 30 is driving PMOS transistor 34 which is a large device and has a large gate capacitance. In another embodiment, inverter 30 can be implemented as a series of inverters with increasing driver capabilities as shown in FIG. 3. In FIG. 3, inverters 90a, 90b and 90c implement inverter 30 of FIG. 2. Inverter 90a has a size of 1×, inverter 90b has a size of 3×, and inverter 90c has a size of 15× and drives the gate terminal of PMOS transistor 34. In the driver circuit of FIG. 3, a series of three inverters is used to increase the drive capability from 1× to 15×. Of course, other combination of inverters can be used for amplifying the output signal from NOR gate 27. Typically, for optimal operation, a MOS transistor can be disposed to drive an output load about four times its size. Thus, by using a series of inverters with progressively increasing drive capability, the desired final drive capability can be obtained without sacrificing speed and performance. Returning to FIG. 2, in the present embodiment, the first control path for driving PMOS transistor 34 is implemented using NOR gate 27 and inverter 30. Of course, in another embodiment, the first control path can be implemented using an OR gate and an non-inverting amplifier to provide the same logic function and drive capability for driving PMOS transistor 34.

Lower driver circuit 20a includes a second control path for driving the control terminal of the lower driver device which is NMOS transistor 36 in the present embodiment. The second control path includes an NAND gate 28 and an inverter 32 connected in series. NAND gate 28 receives as input signals the output signal of NOR gate 26 (node 29) and the lower driver lock-out signal (lead 39). The combination of NAND gate 28 and inverter 32 generates an output signal for driving the gate terminal of NMOS transistor 36. In operation, NMOS transistor 36 is turned on only when the output signal of NAND gate 26 and the lower driver lock-out signal are both at a logic high level. Similar to the operation of PMOS transistor 34, the lower driver lock-out signal causes NMOS transistor 36 to be turned on only briefly for turning off lower power transistor 64. Then, NMOS transistor 36 is turned off (or put in an high impedance state) by the action of the lower driver lock-out signal.

Inverter 32 of the second control path functions as an amplifier for amplifying the output signal of NAND gate 28. In one embodiment, inverter 32 can be implemented as a series of inverters with increasing drive capabilities. As shown in FIG. 3, inverter 32 can be implemented as three inverters 92a, 92b and 92c. In FIG. 3, inverter 92a has a size of 1×, inverter 92b has a size of 3×, and inverter 92c has a size of 15×. Returning to FIG. 2, in another embodiment, NAND gate 28 and inverter 32 can be implemented as an AND gate and an non-inverting amplifier to provide the same logic function and drive capability for driving NMOS transistor 36.

Lastly, lower driver circuit 20a includes a third control path, also called the gate holding path, including an inverter 31. Inverter 31 has an input terminal coupled to receive the output signal from NAND gate 26 (node 29) and an output terminal coupled to output terminal 35 of the driver devices. Inverter 31 generates an output signal having the same logic level as the output signal generated by transistors 34 and 36 at output terminal 35. At each transition of lower power transistor 64, inverter 31 functions to initiate the transitions of the control voltage of lower power transistor 64. Then, one of the driver devices (transistors 34 and 36) takes over and drives the control terminal of the power transistor pass the logic threshold level plus some delay time. At that point, the respective driver device is turned off by the operation of the lower driver lock-out signal, inverter 31 completes the transition of lower power transistor 64 and holds the control voltage at the control terminal of lower power transistor 64. Thus, after each transition of lower power transistor 64, power transistor 64 is only driven by inverter 31 in the gate holding path while both the first control path and the second control path are turned off or put in a high impedance state. Inverter 31 of the third control path has a drive capability much less than the drive capability of either the upper driver device or the lower driver device. Thus, the on or off state of the upper and lower driver devices is held only by a "weak" device in the gate holding path and any shoot-through current occurring in the "weak" device would be small so as not to impact circuit performance. In the present embodiment, inverter 31 also serves as an amplifier for amplifying the output signal of NAND gate 26. In another embodiment, inverter 31 can be implemented as a series of inverters (91a–91c) as shown in FIG. 3. The output signal at output terminal 35 is also the upper switch lock-out signal to be coupled to the upper driver circuit 20b on lead 40. The upper switch lock-out signal prevents upper driver circuit 20b from turning on when lower power transistor 64 is turned on.

Lower driver circuit 20a further includes a delay element 38 coupled to output terminal 35 of the driver devices. Delay element 38 generates the lower driver lock-out signal on lead 39. Thus, the lower driver lock-out signal is a delayed version of the NGATE control signal generated by inverter 31 and driver devices 34 and 36. As described above, the lower driver lock-out signal is used to turn off driver devices 34 and 36 after the control voltage of the lower power transistor move past a logic threshold level plus some delay time. In the present embodiment, lower driver circuit 20a estimates the on-time of the driver devices by including a predetermined amount of delay in delay element 38. In one example, when the output signal at output terminal 35 switches from a low logic level (such as 0 volt) to a high logic level (such as 6 volts), delay element 38 delays the transition of the lower driver lock-out signal until the control voltage at the control terminal of the lower power transistor passes the logic threshold level which is 3 volt and some additional delay time. When the lower driver lock-out signal transitions, PMOS transistor 34 is turned off and inverter 31 of the gate holding path is left maintaining the on-state of lower power transistor 64.

The upper driver circuit 20b of driver circuit 20 is constructed in a similar manner as lower driver circuit 20a. Upper driver circuit 20b includes a NOR gate 46 for receiving as input signals the switch control signal XON (lead 21) and the upper switch lock-out signal (on lead 40). Thus, NOR gate 46 generates a logic high level as output signal (on node 49) only when the signal XON and the upper switch lock-out signal are both at a logic low level. NOR gate 46 determines whether and when upper power transistor 62 is to be turned on. Upper power transistor 62 is to be turned on when NOR gate 46 outputs a logic high level. Otherwise, upper power transistor 46 is to be turned off. The upper switch lock-out signal, generated by lower driver circuit 20a at node 35, indicates when lower power transistor 64 is turned on. When lower transistor 64 is turned on, the upper switch lock-out signal has a high logic level, prohibiting upper driver circuit 20b from turning on upper power transistor 62. In this manner, primary anti-shoot-through protection for power transistors 62 and 64 is provided.

Upper driver circuit 20b includes three control paths constructed in the same manner as those of lower driver circuit 20a. A first control path, including an NOR gate 47 and an inverter 50, generates the control signal for the upper driver device (PMOS transistor 54). NOR gate 47 receives as input signals the output signal of NOR gate 46 (node 49) and an upper driver lock-out signal on lead 59. Of course, an OR gate with an non-inverting amplifier can also be used in place of NOR gate 47 and inverter 50. In operation, the upper driver lock-out signal functions to turn off PMOS transistor 54 after PMOS transistor 54 acts to turn off upper power transistor 62 in response to a high logic level on the switch control signal XON.

A second control path of upper driver circuit 20b, including an NAND gate 48 and an inverter 52, generates the control signal for the lower driver device (NMOS driver device 56). NAND gate 48 receives the same set of input signals as NOR gate 47. Of course, an AND gate with an non-inverting amplifier can be used in place of NAND gate 48 and inverter 52. In operation, the upper driver lock-out signal functions to turn off NMOS transistor 56 after NMOS transistor 56 acts to turn on upper power transistor 62 in response to a low logic level on the switch control signal XON. Thus, when upper power transistor 62 is to be turned on or off, NMOS transistor 56 and PMOS transistor 54 are only turned on briefly and then are shut off by the action of the upper driver lock-out signal.

The third control path, also called the gate holding path, of upper driver circuit 20b includes an inverter 51 coupled between node 49 and node 55. Inverter 51 functions to hold the logic level at output node 55 and to maintain the control voltage of upper power transistor 62 after the driver devices are turned off. The output signal at node 55 is also the lower switch lock-out signal coupled to lower driver circuit 20a on lead 60.

Upper driver circuit 20b further includes a delay element 58 coupled to output terminal 55 of the driver devices and generating the upper driver lock-out signal on lead 59. The upper driver lock-out signal operates in the same way as the lower driver lock-out signal described above. Delay element 59 is used to estimate when the control voltage of upper power transistor 62 has passed the logic threshold level plus some delay time. The upper driver lock-out signal then transitions to turn off the driver devices (transistors 54 and 56). The control terminal of power transistor 62 is then driven only by inverter 51 in the gate holding path. The upper driver lock-out signal, in cooperation with NOR gate 47 and NAND gate 48, functions to provide secondary anti-shoot-through protection to driver devices 54 and 56.

In another embodiment, each of inverters 50, 51 and 52 of upper driver circuit 20b can be implemented as a series of inverters having increasing drive capabilities to provide the necessary amplifying function. In one embodiment, each of inverters 50, 51, and 52 is implemented as a chain of three inverters (e.g. inverters 110a–c, 111a–c and 112a–c) having increasing drive capabilities of 1×,3× and 15× as shown in FIG. 3.

Delay elements 38 and 58 of driver circuit 20 can be implemented using any conventional techniques known in the art for introducing propagation delay in a signal path. In one embodiment, delay elements 38 and 58 are each implemented as a pair of inverters connected in series (e.g. inverters 98 and 118) as shown in FIG. 3. Of course, the number of inverters can be varied to obtain the desired propagation delay.

In driver circuit 20, the selection of NAND gate 26 and NOR gate 46 for use in either the upper or the lower driver circuits depends on the state of the switch control signal XON. If the power transistor is to be turned on when signal XON is high, then an NAND gate is used in the driver circuit portion. If the power transistor is to be turned on when signal XON is low, then an NOR gate is used in the driver circuit portion. The function of NAND gate 26 and NOR gate 46 is to provide primary anti-shoot-through protection to upper and lower power transistors 62 and 64. Because NAND gate 26 and NOR gate 46 are each gated with a switch lock-out signal, even if the switch control signal XON transitions, NAND gate 26 and NOR gate 46 will prevent the power transistor it is driving from turning on until the switch lock-out signal indicates that the other power transistor is turned off. In the present embodiment, the delay time to turn on a power transistor is determined by the propagation delay in inverter 31 or 51. The timing of the switch lock-out signal can be adjusted so that the OFF-ON sequence of the power transitions can either be spaced apart or be closely aligned. For example, additional delay can be included in signal paths 40 and 60 to space apart the OFF-ON sequence to ensure more effective primary anti-shoot-through protection.

Driver circuit 20 of the present invention provides secondary anti-shoot-through protection through the use of the upper driver lock-out signal (lead 59), the lower driver lock-out signal (lead 39) and the gate holding paths in each of the upper and lower driver circuits. The operation of the secondary anti-shoot-through protection in each of lower driver circuit 20a and upper driver circuit 20b is the same except for polarities of the control signals. Therefore, only the operation of the secondary anti-shoot-through protection in lower driver circuit 20a will be described.

With respect to lower driver circuit 20a, anti-shoot-through protection for the driver devices (PMOS transistor 34 and NMOS transistor 36) is provided to ensure that both transistors are never turned on at the same time. In fact, the lower driver lock-out signal causes transistors 34 and 36 to be turned off as soon as lower power transistor 64 completes its transition. In the present embodiment, a power transistor is deemed to have "completed" its transition when the control voltage of the power transistor passes the logic threshold level. After either of the driver devices is turned off, inverter 31 of the gate holding path is relied upon to sustain the control voltage at the control terminal of lower power transistor 64. Thus, both transistors 34 and 36 are maintained in an off state after each power transistor transition. When the next transition in power transistor 64 occurs, either one of transistors 34 and 36 can be turned on immediately and shoot-through is eliminated because the other one of transistors 34 and 36 is already turned off. Secondary anti-shoot-through protection in the driver devices is thus realized. The secondary anti-shoot-through protection provided by the lower driver lock-out signal in lower driver circuit 20a has an additional benefit of setting up the first and second control paths for the next power transistor transition at the end of each transition. For example, when lower power transistor 64 is to be turned on, PMOS transistor 34 is turned on briefly to drive the transition of the gate voltage of lower power transistor 64 and PMOS transistor 64 is then turned off. The lower driver lock-out signal (lead 39) has a high logic level and drives one input terminal of NAND gate 28. Thus, NAND gate 28 is set up to transition whenever the switch control signal XON changes for turning off lower power transistor 64. By setting up the next ON-OFF transition sequence at the end of each ON-OFF transition, driver circuit 20 of the present invention can operate at a higher frequency than conventional driver circuits. One skilled in the art would appreciate that the operation of the secondary anti-shoot-through protection in upper driver circuit 20b is the same as that of lower driver circuit 20a for eliminating shoot-through conditions at PMOS transistor 54 and NMOS transistor 56 of upper driver circuit 20b. In driver circuit 20, the only possibility for shoot-through to occur is at the inverters 30–32 and 50–52. Because these inverters are smaller devices, shoot-through conditions occurring at these inverters can usually be tolerated and in most cases, they have only negligible impact on circuit performance.

The operation of driver circuit 20 will now be described by way of an example for turning on upper power transistor 62. Driver circuit 20 is assumed to have an initial condition where the switch control signal XON is at a logic high level and lower power transistor 64 is turned on while upper power transistor 62 is turned off. Thus, the control signal PGATE (lead 22) has a logic high value maintained by inverter 51 of upper driver circuit 20b where the control signal NGATE (lead 24) also has a logic high value maintained by inverter 31 of lower driver circuit 20a. Moreover, in the initial condition, driver devices 34, 36, 54 and 56 are all turned off and are in a high impedance state. Only inverters 31 and 51 are driving output nodes 35 and 55 respectively. Furthermore, in the initial condition, the second path of lower driver circuit 20a (NAND gate 28 and inverter 32) is enabled by lower driver lock-out signal (lead 39) and can be activated in response to a transition in the switch control signal XON to turn off lower power transistor 64. Similarly, the second control path of upper driver circuit 20b (NAND gate 48 and inverter 52) is enabled by upper driver lock-out signal (lead 59) and can be activated in response to a transition in the switch control signal XON to turn on upper power transistor 62.

The upper switch lock-out signal (lead 40) acts to prohibit NOR gate 46 from transitioning even when the switch control signal XON changes state. Thus, in the initial condition, upper switch lock-out signal (lead 40) is at a logic high level. The output signal of NOR gate 46 will remain at a logic low level even when signal XON transitions from the high logic level it is presently at to a low logic level for turning on upper power transistor 62. The output signal of NOR gate 46 is prohibited from transitioning until the upper switch lock-out signal changes to a low logic level indicating that lower power transistor 64 has turned off. In this manner, anti-shoot-through protection for the power transistors is provided.

When switch control signal XON transitions from a high logic level to a low logic level for turning off lower power transistor 64 and turning on upper power transistor 62, the output signal (node 29) of NAND gate 26 transitions to a high logic level. Inverter 31, in response to the transition at node 29, drives node 35 to a logic low level and begins to move the control signal NGATE towards ground. NAND gate 28 sees a logic high level at both of its inputs (node 29 and lower driver lock-out signal which is at a high logic level) and generates an output signal having a low logic level. Inverter 32 inverts and amplifies the output signal of NAND gate 28 and drives the gate terminal of NMOS transistor 36 to turn the transistor on. No shoot-through condition will occur when NMOS transistor 36 is turned on because PMOS transistor 34 is already turned off. NMOS transistor 36 assumes the role of further pulling down control signal NGATE (node 35) to the ground potential. Lower power transistor 64, driven by control signal NGATE, begins to turn off as its gate potential decreases through the action of NMOS transistor 36. NMOS transistor 36 will continue to drive the control terminal of lower power transistor 64 until the control voltage decreases past the logic threshold level plus some delay time. Delay element 38 generates the lower driver lock-out signal on lead 39 which is a delayed version of the high-to-low transition at node 55. Thus, after the delay time provided by delay element 38, the lower driver lock-out signal transitions to a low logic level and acts to turn off the second control path. The delay time is chosen to be sufficient for NMOS transistor 36 to drive lower power transistor 64 unit the power transistor completes its transition. Thereafter, only inverter 31 is left to drive node 35 and maintain the gate voltage of lower power transistor 64.

At the same time lower power transistor 64 begins to turn off, the upper switch lock-out signal (on lead 40) coupled to NOR gate 46 transitions from a high logic level to a low logic level. The transition of the upper switch lock-out signal releases the lock-out of upper driver circuit 20b and NOR gate 46 transitions to a logic high level. Inverter 51 in the gate holding path begins to drive node 55 to ground in response to the output signal on node 49. NAND gate 48 and inverter 52 in response transition to drive the gate terminal of NMOS transistor 56 for turning on the transistor. NMOS transistor 56 assumes the role of driving node 55 to ground. No shoot-through occurs when NMOS transistor 56 turns on because PMOS transistors 54 is already in an off state. Control signal PGATE, in response to the transition at node 55, drives the gate terminal of upper power transistor 62, turning on the transistor. Thus, the turning on of upper power transistor 62 is delayed by the operation of upper switch lock-out signal and the propagation delay of the second control path of the upper driver circuit. In this manner, driver circuit 20 ensures that lower power transistor 64 is sufficiently turned off to avoid shoot-through conditions at the power transistors.

While NMOS transistor 56 acts to drive the gate terminal of upper power transistor 62 to the ground potential, delay element 58 generates the upper driver lock-out signal on lead 59 which is a delayed version of the high-to-low transition at node 55. Thus, after the delay time provided by delay element 58, the upper driver lock-out signal transitions to a low logic level and acts to turn off the second control path. The delay time is chosen to be sufficient for NMOS transistor 56 to drive upper power transistor 62 until the power transistor completes its transition. Typically, a delay time sufficient for NMOS transistor 56 to drive the gate voltage of upper power transistor 62 past the logic threshold level is needed. NAND gate 48 and inverter 52, in response to the transition of the upper driver lock-out signal, transitions to a low logic level at the gate terminal of NMOS transistor 56, turning off NMOS transistor 56. Thus, only inverter 51 is left to drive node 55 and maintain the gate voltage of upper power transistor 62.

At the same time that upper driver circuit 20b completes the turn-on sequence for upper power switch 62, upper driver circuit 20b also sets up the first control path for the subsequent turn-off sequence. NOR gate 47 is driven with the upper driver lock-out signal having a low logic level. Thus, whenever switch control signal XON transitions, NOR gate 47 and inverter 50 transition in response to turn on PMOS transistor 54 for driving the gate terminal of upper power transistor 62 to the VIN voltage and turning off the power transistor. Similarly, as lower driver circuit 20a completes the turn-off sequence, lower driver circuit 20a also sets up its first control path for the subsequent turn-on sequence. NOR gate 27 is being driven with the lower driver lock-out signal having a low logic value. When the switch control signal XON transitions, NOR gate 27 and inverter 30 transition in response to turn on PMOS transistor 34 for driving the gate terminal of lower power transistor 64 to the VIN voltage and turning on the power transistor. The lower switch lock-out signal (lead 60) has a low logic level, preventing lower driver circuit 20a from turning lower power transistor 64 on even when the switch control signal XON transitions.

The above description of the operation of driver circuit 20 concerns turning on of upper power transistor 62 and turning off of lower power transistor 64. Of course, one of ordinary skill in the art would appreciate that the operation to turn on lower power transistor 64 and to turn off upper power transistor 62 is analogous to the operation described above with corresponding changes in the polarities of the signals. In either case, driver circuit 20 operates to eliminate shoot-through conditions at the power transistors and at the driver devices. The driver circuit of the present invention can be used in high frequency switching regulators for improving the efficiency of the power switches in a half-bridge configuration. The driver circuit also minimizes the overlap times between the turning on and the turning off of the power transistors.

FIG. 3 illustrates one implementation of the driver circuit of the present invention using MOS transistors. In FIG. 3, each of the inverters in FIG. 2 is implemented as a series of three inverters with increasing drive capabilities. Furthermore, the delay elements are implemented as two inverters in series. In this exemplary embodiment, the driver circuit is fabricated using a 1.2 $\mu$m CMOS process. The sizes of the driver devices are as follows:

|  |  | Device Type | Device Width |
|---|---|---|---|
| Upper Driver Circuit | Upper Driver Device | PMOS | 2000 $\mu$m |
|  | Lower Driver Device | NMOS | 3000 $\mu$m |
| Lower Driver Circuit | Upper Driver Device | PMOS | 500 $\mu$m |
|  | Lower Driver Device | NMOS | 500 $\mu$m |

Referring to FIG. 3, inverters 98a and 98b and inverters 118a and 118b of the delay elements are 1×devices. Also, in the present embodiment, an inverter 112d is coupled in parallel to inverter 112c for driving NMOS transistor 56 in the upper driver circuit. Inverter 112d is optional and is included in the present implementation to increase the drive capability of inverter 112c. Inverter 112d has a drive capability of 15×.

The driver circuit of the present invention can be fabricated as an integrated circuit. Typically, the driver circuit and the power transistors are fabricated on the same piece of integrated circuit. Of course, the driver circuit can be fabricated on a separate integrated circuit as the power transistors.

The above detailed descriptions are provided to illustrate specific embodiments of the present invention and are not intended to be limiting. Numerous modifications and variations within the scope of the present invention are possible. For example, while the above embodiments illustrate implementing the driver circuits of the present invention using MOS transistors, the driver circuits of the present invention can also be implemented using bipolar transistors. Also, while the driver circuits described herein are operated with MOS power transistors, the driver circuits of the present invention can be used with bipolar power transistors or power switches as well. The present invention is defined by the appended claims.

I claim:

1. A driver circuit for alternately driving a first transistor and a second transistor in response to a switch control signal, said first and second transistors being connected in series between a first power supply and a second power supply and generating an output voltage at an output node for driving a load, comprising:

a first driver circuit portion for driving a control terminal of said first transistor in response to said switch control signal, said first driver circuit portion comprising:
  a first control path for generating a turn-on signal for turning on said first transistor;
  a second control path for generating a turn-off signal for turning off said first transistor; and
  a third control path for generating a holding signal for holding an on or off state of said control terminal of said first transistor, said third control path having a drive capability less than a drive capability of said first control path or said second control path;
  wherein said first control path enables said turn-on signal and said third control path enables said hold signal only after said second transistor is turned off; said first control path disables said turn-on signal and said second control path disables said turn-off signal when said control terminal of said first transistor has moved to a respective on or off state; and said holding signal of said third control path holds said on-off state of said control terminal of said first transistor when said turn-on signal or said turn-off signal is disabled.

2. The driver circuit of claim 1, further comprising:

a second driver circuit portion for driving a control terminal of said second transistor in response to said switch control signal, said second driver circuit portion comprising:
  a fourth control path for generating a turn-on signal for turning on said second transistor;
  a fifth control path for generating a turn-off signal for turning off said second transistor; and
  a sixth control path for generating a holding signal for holding an on or off state of said control terminal of said second transistor, said sixth control path having a drive capability less than a drive capability of said fourth control path or said fifth control path;
  wherein said fourth control path enables said turn-on signal and said sixth control path enables said hold signal only after said first transistor is turned off; said fourth control path disables said turn-on signal and said fifth control path disables said turn-off signal when said control terminal of said second transistor has moved to a respective on or off state; and said holding signal of said sixth control path holds said on-off state of said control terminal of said second transistor when said turn-on signal or said turn-off signal is disabled.

3. The driver circuit of claim 1, wherein:

said first control path comprises a first logic circuit for providing an OR function, a first amplifier, and a first driver device connected in series;

said second control path comprises a second logic circuit for providing an AND function, a second amplifier, and a second driver device connected in series;

said first driver device and said second driver device are connected in series between said first power supply and said second power supply, and an output node between said first driver device and said second driver device is coupled to said control terminal of said respective one of said first transistor or second transistor;

said third control path comprises an inverter; and a third logic circuit coupled to said first, second and third control paths, said third logic circuit generating an output signal in response to said switch control signal and a switch lock-out signal indicative of an on-off status of an opposite one of said first or second transistor.

4. A driver circuit for alternately driving a first transistor and a second transistor in response to a switch control signal, said first transistor being connected in series with a second transistor between a first power supply and a second power supply, comprising:

a first driver circuit portion for driving a control terminal of said first transistor in response to said switch control signal, said first driver circuit portion comprising:
  a first driver device and a second driver device connected in series between said first power supply and said second power supply, said first and second driver devices generating a control signal at an output node between said first and second driver devices, said control signal being coupled to said control terminal of said first transistor for controlling an on-off state of said first transistor;
  a first logic circuit having a first input terminal coupled to receive said switch control signal, a second input terminal coupled to receive a first lock-out signal, and an output terminal, said first lock-out signal indicating an on-off status of said second transistor, and said switch control signal having a first state for turning said first transistor on and turning said second transistor off, and a second state for turning said second transistor on and turning said first transistor off;
  a second logic circuit for providing an OR function having a first input terminal coupled to said output terminal of said first logic circuit, a second input terminal coupled to receive a second lock-out signal, and an output terminal;
  a first amplifier having an input terminal coupled to said output terminal of said second logic circuit and generating an output signal for driving said first driver device;
  a third logic circuit for providing an AND function having a first input terminal coupled to said output terminal of said first logic circuit, a second input terminal coupled to receive said second lock-out signal, and an output terminal;
  a second amplifier having an input terminal coupled to said output terminal of said third logic circuit and generating an output signal for driving said second driver device;
  a first inverter having an input terminal coupled to said output terminal of first logic circuit and an output terminal coupled to said output node of said first and second driver devices, said output terminal generating a third lock-out signal for said second transistor; and
  a delay element coupled to said output node of said first and second driver devices and generating said second lock-out signal.

5. The driver circuit of claim 4, wherein when said switch control signal changes from said second state to said first state, said first logic circuit delays said first transistor from turning on until said first lock-out signal indicates that said second transistor is turned off.

6. The driver circuit of claim 4, wherein said first logic circuit provides a NOR function when said first transistor is to be turned on when said switch control signal has a low logic level.

7. The driver circuit of claim 6, wherein said first transistor is a PMOS transistor.

8. The driver circuit of claim 6, wherein said first transistor is an NMOS transistor and said circuit further comprises:
   an inverter coupled to said output node of said first and second driver devices for inverting a logic state of said control signal for said first transistor.

9. The driver circuit of claim 4, wherein said first logic circuit provides a NAND function when said first transistor is to be turned on when said switch control signal has a high logic level.

10. The driver circuit of claim 9, wherein said first transistor is an NMOS transistor.

11. The driver circuit of claim 9, wherein said first transistor is a PMOS transistor and said circuit further comprises:
    an inverter coupled to said output node of said first and second driver devices for inverting a logic state of said control signal for said first transistor.

12. The driver circuit of claim 4, wherein said first inverter comprises a plurality of inverters connected in series, said plurality of inverters having increasing drive capability between a first one and a last one of said plurality of inverters.

13. The driver circuit of claim 4, wherein said first inverter comprises a CMOS inverter.

14. The driver circuit of claim 4, wherein said first inverter comprises a bipolar inverter.

15. The driver circuit of claim 4, wherein said second logic circuit is an OR gate.

16. The driver circuit of claim 4, wherein said second logic circuit is an NOR gate and said first amplifier is an inverting amplifier.

17. The driver circuit of claim 16, wherein said inverting amplifier comprises a plurality of inverters connected in series, said plurality of inverters having increasing drive capability between a first one and a last one of said plurality of inverters.

18. The driver circuit of claim 4, wherein said third logic circuit is an AND gate.

19. The driver circuit of claim 4, wherein said third logic circuit is an NAND gate and said second amplifier is an inverting amplifier.

20. The driver circuit of claim 18, wherein said inverting amplifier comprises a plurality of inverters connected in series, said plurality of inverters having increasing drive capability between a first one and a last one of said plurality of inverters.

21. The driver circuit of claim 4, wherein said first and second driver devices are MOS transistors.

22. The driver circuit of claim 21, wherein said first driver device is a PMOS transistor and said second driver device is an NMOS transistor.

23. The driver circuit of claim 4, wherein said first and second driver devices are bipolar transistors.

24. The driver circuit of claim 23, wherein said first driver device is a PNP transistor and said second driver device is an NPN transistor.

25. The driver circuit of claim 4, wherein said first transistor and said second transistor are MOS transistors.

26. The driver circuit of claim 4, wherein said first transistor and said second transistor are bipolar transistors.

27. The driver circuit of claim 4, wherein said driver circuit is fabricated as an integrated circuit.

28. The driver circuit of claim 27, wherein said driver circuit and said first and second transistors are fabricated on the same integrated circuit.

29. The driver circuit of claim 4, wherein said first power supply is a positive power supply.

30. The driver circuit of claim 4, wherein said second power supply is ground or a negative power supply.

31. The driver circuit of claim 4, wherein said first inverter has a drive capability less than a drive capability of said first or second driver device.

32. The driver circuit of claim 4, further comprising:
    a second driver circuit portion for driving a control terminal of said second transistor in response to said switch control signal, said second driver circuit portion comprising:
      a third driver device and a fourth driver device connected in series between said first power supply and said second power supply, said third and fourth driver devices generating a control signal at an output node between said third and fourth driver devices, said control signal being coupled to said control terminal of said second transistor for controlling an on-off state of said second transistor;
      a fourth logic circuit having a first input terminal coupled to receive said switch control signal, a second input terminal coupled to receive said third lock-out signal, and an output terminal, said third lock-out signal indicating an on-off status of said first transistor;
      a fifth logic circuit for providing an OR function having a first input terminal coupled to said output terminal of said fourth logic circuit, a second input terminal coupled to receive a fourth lock-out signal, and an output terminal;
      a third amplifier having an input terminal coupled to said output terminal of said fifth logic circuit and generating an output signal for driving said third driver device;
      a sixth logic circuit for providing an NAND function having a first input terminal coupled to said output terminal of said fourth logic circuit, a second input terminal coupled to receive said fourth lock-out signal, and an output terminal;
      a fourth amplifier having an input terminal coupled to said output terminal of said sixth logic circuit and generating an output signal for driving said fourth driver device;
      a second inverter having an input terminal coupled to said output terminal of fourth logic circuit and an output terminal coupled to said output node of said third and fourth driver devices, said output terminal generating said first lock-out signal for said first transistor; and
      a second delay element coupled to said output node of said third and fourth driver devices and generating said fourth feedback signal.

33. The driver circuit of claim 32, wherein said first transistor is a NMOS transistor and said second transistor is a PMOS transistor.

34. The driver circuit of claim 32, wherein said first and third driver devices are PMOS transistors and said second and fourth driver devices are NMOS transistors.

35. The driver circuit of claim 32, wherein said fifth logic circuit is a NOR gate, said sixth logic circuit is a NAND gate, and said third and fourth amplifiers are each an inverting amplifier.

36. A method for alternately driving a first transistor and a second transistor connected in series in response to a switch control signal, comprising:

generating a first lock-out signal indicating an on-off status of said first transistor, wherein said first lock-out signal transitions a first delay time after a transition said switch control signal;

preventing said second transistor from turning on when said first lock-out signal indicates said first transistor is turned on;

turning off said first transistor in response to a transition of said switch control signal; and turning on said second transistor when said first lock-out signal indicates said first transistor is turned off, said turning on comprising:

driving a control terminal of said second transistor to a first voltage level using a first driver device, thereby turning on said second transistor;

turning off said first driver device after said second transistor is turned on; and driving said control terminal of said second transistor using a first holding device.

37. The method of claim 36, wherein said first driver device is a MOS transistor having a large drive capability and said first holding device is a MOS transistor having a drive capability less than said first driver device.

38. The method of claim 36, wherein said first voltage level is substantially equal to a logic threshold level.

39. The method of claim 36, wherein said turning off said first transistor comprises:

driving said control terminal of said first transistor to a second voltage level using a second driver device, thereby turning off said first transistor;

turning off said second driver device after said first transistor is turned off; and driving said control terminal of said first transistor using a second holding device.

40. The method of claim 39, wherein said second voltage level is substantially equal to a logic threshold level.

41. The method of claim 39, wherein said second driver device is a MOS transistor having a large drive capability and said second holding device is a MOS transistor having a drive capability less than said second driver device.

42. A method for driving a first transistor, connect in series with a second transistor, in response to a switch control signal, comprising:

turning on said first transistor in response to said switch control signal, said turning on comprising:

driving a control terminal of said first transistor to a first voltage level using a first driver device, thereby turning on said first transistor;

turning off said first driver device after said first transistor is turned on; and driving said control terminal of said first transistor using a first holding device.

43. The method of claim 42, further comprising:

turning off said first transistor in response to said switch control signal, said turning off comprising:

driving said control terminal of said first transistor to a second voltage level using a second driver device, thereby turning off said first transistor;

turning off said second driver device after said first transistor is turned off; and driving said control terminal of said first transistor using said first holding device.

44. The method of claim 42, wherein said first voltage level is substantially equal to a logic threshold level.

45. The method of claim 43, wherein said first driver device and said second driver device are each a MOS transistor having a large drive capability and said first holding device is a MOS transistor having a drive capability less than said first driver device or said second driver device.

46. The method of claim 43, wherein said second voltage level is substantially equal to a logic threshold level.

* * * * *